United States Patent
Fukuda

(10) Patent No.: US 9,237,281 B2
(45) Date of Patent: Jan. 12, 2016

(54) IMAGE SENSOR COMPRISING PLURAL PIXELS INCLUDING A MICROLENS AND PLURAL PHOTOELECTRIC CONVERSION PORTIONS AND IMAGE PICKUP APPARATUS COMPRISING SAME

(71) Applicant: Canon Kabushiki Kaisha, Tokyo (JP)

(72) Inventor: Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/628,238

(22) Filed: Sep. 27, 2012

(65) Prior Publication Data

US 2013/0083230 A1    Apr. 4, 2013

(30) Foreign Application Priority Data

Oct. 3, 2011 (JP) ................. 2011-219041
Oct. 3, 2011 (JP) ................. 2011-219042
Sep. 14, 2012 (JP) ................. 2012-202232

(51) Int. Cl.
*H04N 5/225* (2006.01)
*H04N 5/355* (2011.01)
*H01L 27/146* (2006.01)

(52) U.S. Cl.
CPC ...... *H04N 5/35563* (2013.01); *H01L 27/14627* (2013.01)

(58) Field of Classification Search
CPC .................. H04N 5/35563; H01L 27/14627
USPC .................. 348/340, 335; 250/208.1
See application file for complete search history.

(56) References Cited

U.S. PATENT DOCUMENTS

| 4,410,804 | A | 10/1983 | Stauffer |
| 2002/0121652 | A1 | 9/2002 | Yamasaki |
| 2007/0153107 | A1* | 7/2007 | Boettiger et al. ............ 348/273 |

(Continued)

FOREIGN PATENT DOCUMENTS

| CN | 1352402 A | 6/2002 |
| CN | 1892279 A | 1/2007 |
| CN | 1932580 A | 3/2007 |

(Continued)

OTHER PUBLICATIONS

Stanford Tech Report CTSR, Feb. 2005, 1 2005, Light Field Photography with a Hand-held Plenoptic Camera, Marc Levoy, et al.

(Continued)

*Primary Examiner* — Antoinette Spinks
(74) *Attorney, Agent, or Firm* — Cowan, Liebowitz & Latman, P.C.

(57) ABSTRACT

The image sensor 107 includes plural pixels each including a microlens and plural photoelectric conversion portions separated from one another with a separating zone thereamong and photoelectrically converting light fluxes passing through the microlens. The microlens includes a separating zone side lens portion overlapping the separating zone in an optical axis direction of the microlens. When the photoelectric conversion portions photoelectrically convert the light fluxes passing through mutually different areas of an exit pupil of an image capturing optical system, the separating zone side lens portion provides no power or a negative power for a light flux entering the separating zone side lens portion in the light fluxes entering the microlens.

10 Claims, 7 Drawing Sheets

(56) References Cited

U.S. PATENT DOCUMENTS

2009/0256225 A1    10/2009    Nakai et al.
2012/0193515 A1*    8/2012    Agranov et al. ........... 250/208.1

FOREIGN PATENT DOCUMENTS

| EP | 1085751 | A2 | 3/2001 |
| EP | 2164269 | A1 | 3/2010 |
| JP | 2001-083407 | | 3/2001 |

OTHER PUBLICATIONS

Feb. 27, 2105 Chinese Office Action, issued in Chinese Patent Application No. 201210377950.7.

Nov. 5, 2015, Chinese Office Action, issued in Chinese Patent Application No. 201210377950.7.

\* cited by examiner

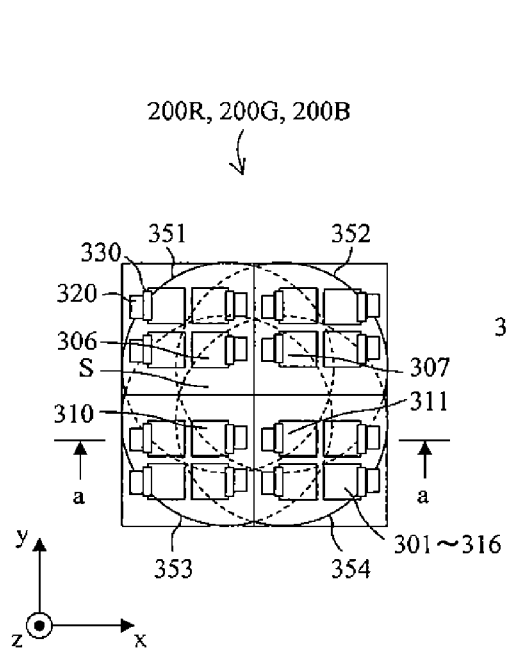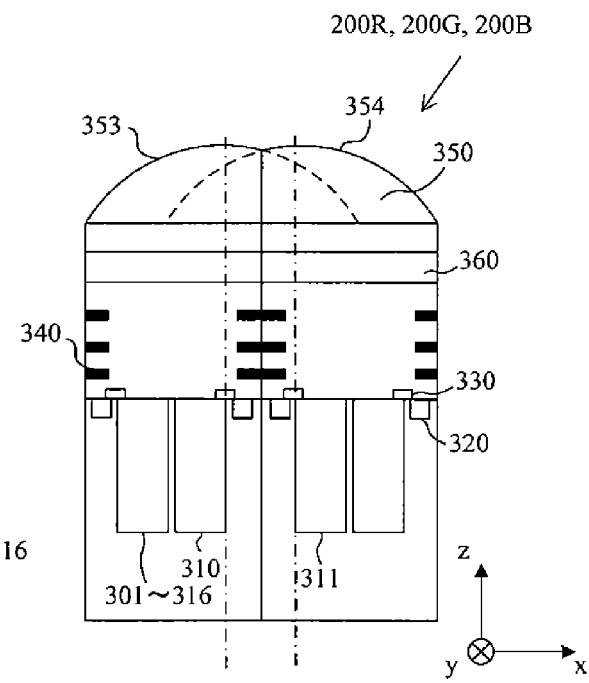
FIG. 3A  FIG. 3B
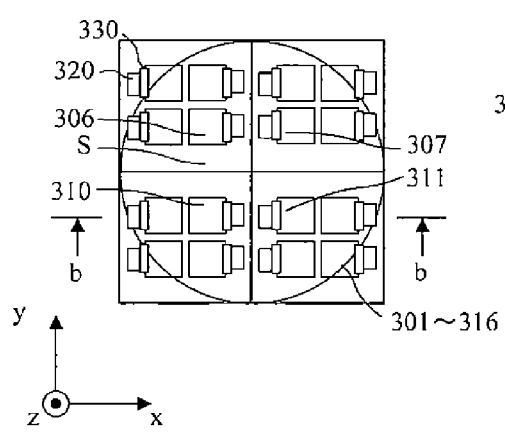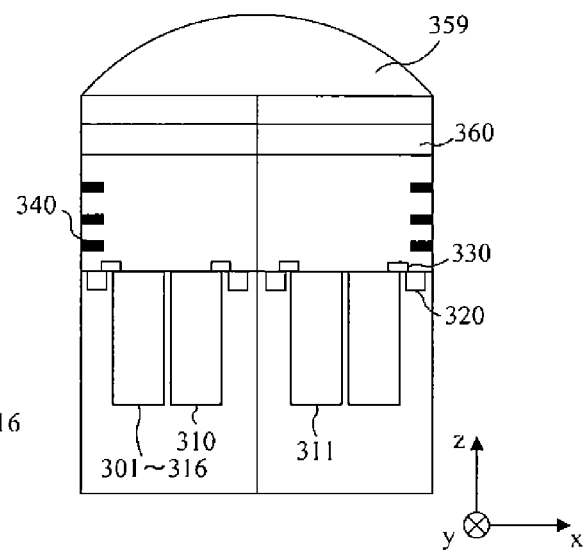
FIG. 4A  FIG. 4B

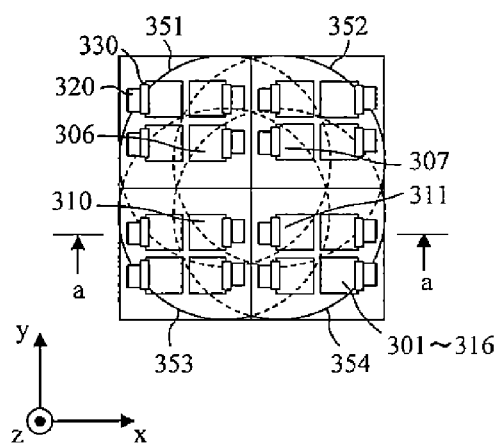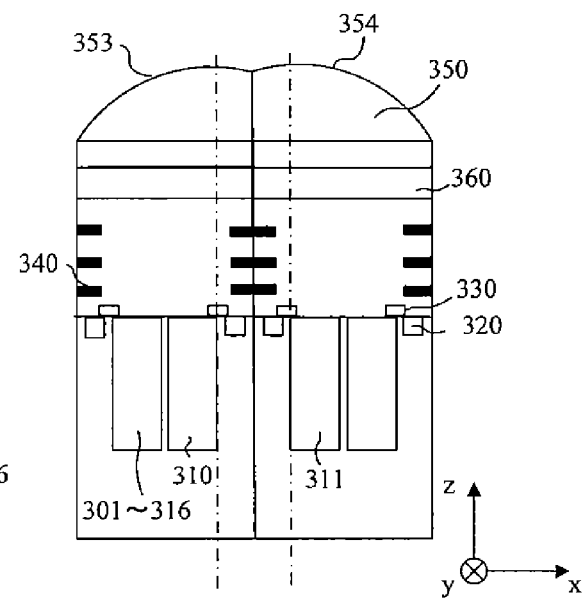
FIG. 8A          FIG. 8B
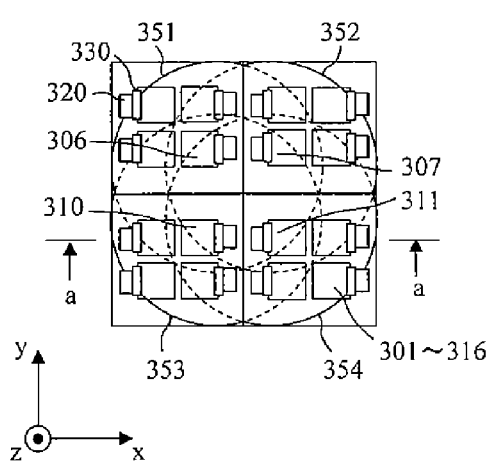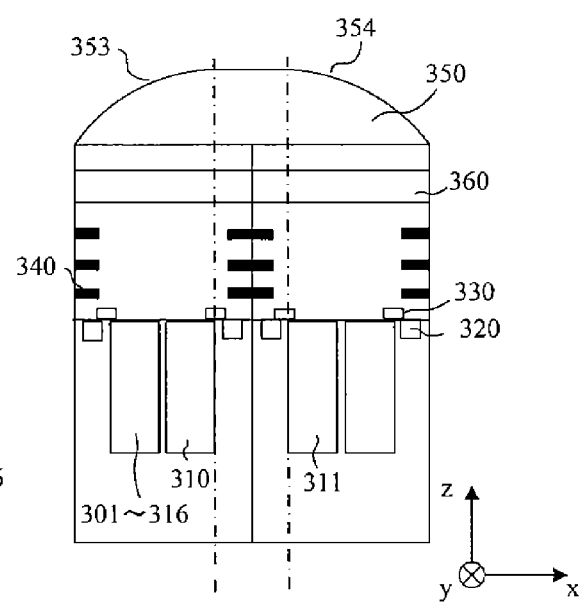
FIG. 9A          FIG. 9B

IMAGE SENSOR COMPRISING PLURAL PIXELS INCLUDING A MICROLENS AND PLURAL PHOTOELECTRIC CONVERSION PORTIONS AND IMAGE PICKUP APPARATUS COMPRISING SAME

BACKGROUND OF THE INVENTION

1. Field of the Invention

The present invention relates to an image sensor to be used for image pickup apparatuses such as digital cameras, and particularly to an image sensor suitable for photoelectric conversion of light fluxes from plural areas of an exit pupil of an image capturing optical system.

2. Description of the Related Art

An image pickup apparatus using such an image sensor is disclosed in U.S. Pat. No. 4,410,804. The disclosed image pickup apparatus uses a two-dimensional image sensor that includes plural pixels each being constituted by one microlens and plural separated photoelectric conversion portions. The separated photoelectric conversion portions receive, through the one microlens, light fluxes from mutually different areas of an exit pupil of an image capturing optical system (the mutually different areas of the exit pupil are hereinafter referred to as "partial pupil areas"), that is, perform pupil division. The disclosed image pickup apparatus can produce, by using electric signals obtained through photoelectric conversion by the photoelectric conversion portions, parallax images corresponding to the partial pupil areas.

The produced parallax images are equivalent to Light Field (LF) data that is information on a spatial distribution and an angular distribution of light intensity. "Stanford Tech Report CTSR 2005-02, 1 (2005)" discloses a refocus technology that reconstructs, by using acquired LF data, an image at a virtual imaging surface different from an image sensor surface to produce a refocus image corresponding to an in-focus position different from that in an original captured image.

Moreover, Japanese Patent Laid-Open No. 2001-083407 discloses an image pickup apparatus that produces a captured image by adding electric signals from all separated photoelectric conversion portions in each of pixels in an image sensor.

Each pixel of such an image sensor includes a separating zone formed among the separated photoelectric conversion portions to separate them from one another. However, the separating zone often has a lower photo sensitivity than those of the photoelectric conversion portions. Such a separating zone forms a low sensitivity zone corresponding to a shape of the separating zone (in other words, a shape of the separated photoelectric conversion portions) in a pupil intensity distribution (in other words, an incident angle distribution of a light-receiving ratio) of each pixel, which may cause unnatural blur in the captured image.

BRIEF SUMMARY OF THE INVENTION

The present invention provides an image sensor capable of suppressing influence of the low sensitivity zone caused in the pupil intensity distribution by forming the plural photoelectric conversion portions separated from one another in each pixel, and provides an image pickup apparatus with the same.

The present invention provides as an aspect thereof an image sensor that includes plural pixels each including a microlens and plural photoelectric conversion portions separated from one another with a separating zone thereamong and photoelectrically converting light fluxes passing through the microlens. The microlens includes a separating zone side lens portion overlapping the separating zone in an optical axis direction of the microlens. When the photoelectric conversion portions photoelectrically convert the light fluxes passing through mutually different areas of an exit pupil of an image capturing optical system, the separating zone side lens portion provides no power or a negative power for a light flux entering the separating zone side lens portion in the light fluxes entering the microlens.

The present invention provides as another aspect thereof an image sensor that includes plural pixels each including a microlens and plural photoelectric conversion portions separated from one another with a separating zone thereamong and photoelectrically converting light fluxes passing through the microlens. The microlens includes a separating zone side lens portion overlapping the separating zone in an optical axis direction of the microlens. When the photoelectric conversion portions photoelectrically convert the light fluxes passing through mutually different areas of an exit pupil of an image capturing optical system, the separating zone side lens portion has a diverging effect for a light flux entering the separating zone side lens portion in the light fluxes entering the microlens.

The present invention provides as still another aspect thereof an image sensor that includes plural pixels each including a microlens and plural photoelectric conversion portions separated from one another with a separating zone thereamong and photoelectrically converting light fluxes passing through the microlens. When the photoelectric conversion portions photoelectrically convert the light fluxes passing through mutually different areas of an exit pupil of an image capturing optical system, the microlens includes plural sub-microlenses having an apex decentered with respect to a center of the pixel in a separation direction of the photoelectric conversion portions.

The present invention provides as yet still another aspect thereof an image pickup apparatus including an image capturing optical system and any one of the above-mentioned image sensors.

Other aspects of the present invention will be apparent from the embodiments described below with reference to the drawings.

BRIEF DESCRIPTION OF THE DRAWINGS

FIGS. 3A and 3B respectively show a front view and a cross-sectional view of the pixel in the image sensor of Embodiment 1.

FIGS. 4A and 4B respectively show a front view and a cross-sectional view of a pixel in an image sensor that is a comparative example.

FIGS. 8A and 8B respectively show a front view and a cross-sectional view of a pixel in an image sensor that is Embodiment 3 of the present invention.

FIGS. 9A and 9B respectively show a front view and a cross-sectional view of a pixel in an image sensor that is Embodiment 4 of the present invention.

DETAILED DESCRIPTION OF THE EMBODIMENTS

Exemplary embodiments of the present invention will be described below with reference to the accompanied drawings.

Embodiment 1

Figure 1:
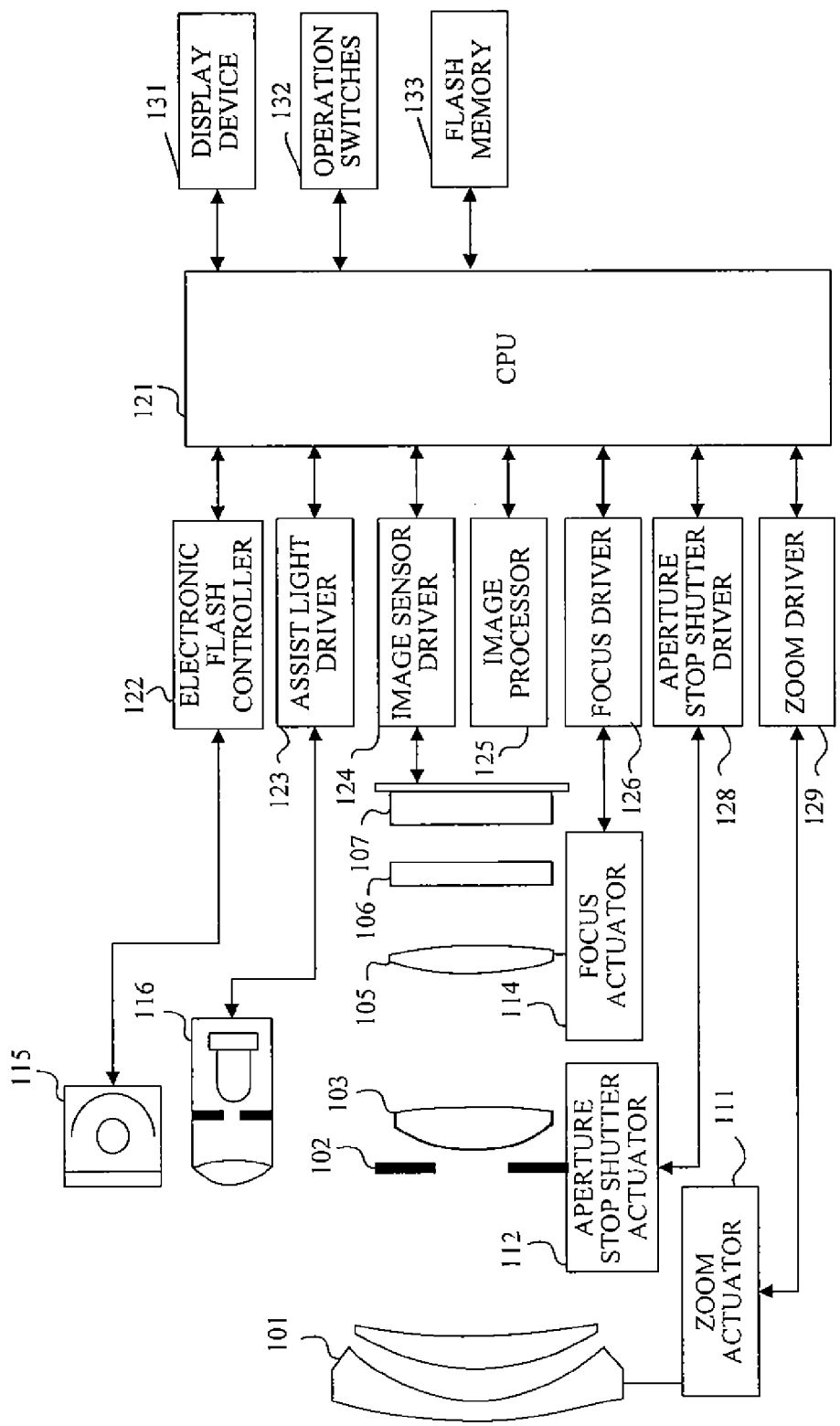
FIG. 1 is a block diagram showing a configuration of an image pickup apparatus provided with an image sensor that is Embodiment 1 of the present invention.

FIG. 1 shows a configuration of a digital camera (image pickup apparatus) provided with an image sensor that is a first embodiment (Embodiment 1) of the present invention. In an image capturing optical system (imaging optical system), reference numeral 101 denotes a first lens group that is disposed at a most object side in the image capturing optical system and is movable in an optical axis direction of the image capturing optical system. Reference numeral 102 denotes an aperture stop shutter unit that changes its aperture diameter to adjust amount of light and to control exposure speed in still image capturing. Reference numeral 103 denotes a second lens group of the image capturing optical system.

The aperture stop shutter unit 102 is moved in the optical axis direction integrally with the second lens group 103. The first lens group 101 and the second lens group 103 are moved in the optical axis direction to perform variation of magnification (zooming).

Reference numeral 105 denotes a third lens group as a focus lens that is movable in the optical axis direction to perform focusing. Reference numeral 111 is a zoom actuator that rotates a cam barrel (not shown) to cause the first and second lens groups 101 and 103 to move in the optical axis direction for the variation of magnification.

Reference numeral 112 denotes an aperture stop shutter actuator that drives stop blades of the aperture stop shutter unit 102 to change the aperture diameter for the light amount adjustment and the exposure speed control. Reference numeral 114 denotes a focus actuator that moves the third lens group 105 in the optical axis direction for the focusing.

Reference numeral 106 denotes an optical low-pass filter that is an optical element for reducing false color and moire in a captured image. Reference numeral 107 denotes the image sensor of this embodiment, which is constituted by a two-dimensional CMOS sensor and its peripheral circuit. The image sensor 107 is disposed at an imaging surface or a vicinity thereof of the image capturing optical system.

Reference numeral 115 denotes an electronic flash that includes a light source such as a xenon tube or an LED. Reference numeral 116 denotes an AF assist light emitter that projects a mask image having a predetermined aperture pattern onto an object through a projection lens. The projection of the mask image enables improvement of focus detection performance for a dark object or a low contrast object.

Reference numeral 121 denotes a camera CPU as a controller that governs control of various operations of the camera. The camera CPU 121 includes a calculation part, a ROM, a RAM, an A/D converter, a D/A converter, a communication interface circuit and others. The camera CPU 121 controls the operations of respective parts in the camera according to computer programs stored in the ROM to perform a series of image capturing/recording operations including an AF (autofocus) operation, an image capturing operation, an image processing operation and a recording operation. The AF operation includes focus detection to detect a focus state of the image capturing optical system and lens drive to move the focus lens to an in-focus position.

Reference numeral 122 denotes an electronic flash controller that controls lighting of the electronic flash 115 in synchronization with the image capturing operation. Reference numeral 123 denotes an assist light driver that controls the lighting of the AF-assist light emitter 116 in synchronization with the focus detection operation. Reference numeral 124 denotes an image sensor driver that controls operations of the image sensor 107 and A/D-converts analog pixel signals (image capturing signals) output from the image sensor 107 to send converted digital image capturing signals to the camera CPU 121. Reference numeral 125 denotes an image processor that performs image processes such as γ conversion and color interpolation on the digital image capturing signals to produce an image signal and performs processes such as JPEG compression on the image signal.

Reference numeral 126 denotes a focus driver that drives the focus actuator 114 based on a result of the focus detection to move the third lens group 105 in the optical axis direction for the focusing. Reference numeral 128 denotes an aperture stop driver that drives the aperture stop shutter actuator 112 to open and close the aperture stop shutter unit 102. Reference numeral 129 denotes a zoom driver that drives the zoom actuator 111 in response to a user's zoom operation.

Reference numeral 131 denotes a display device such as an LCD that displays information on an image capturing mode of the camera, a preview image before the image capturing operation, a confirming image after the image capturing operation and the in-focus state obtained by the AF operation. Reference numeral 132 denotes operation switches that include a power switch, a release switch (image capturing trigger switch), a zoom operation switch and an image capturing mode selection switch. Reference numeral 133 denotes a detachable flash memory that records captured images.

Figure 2:
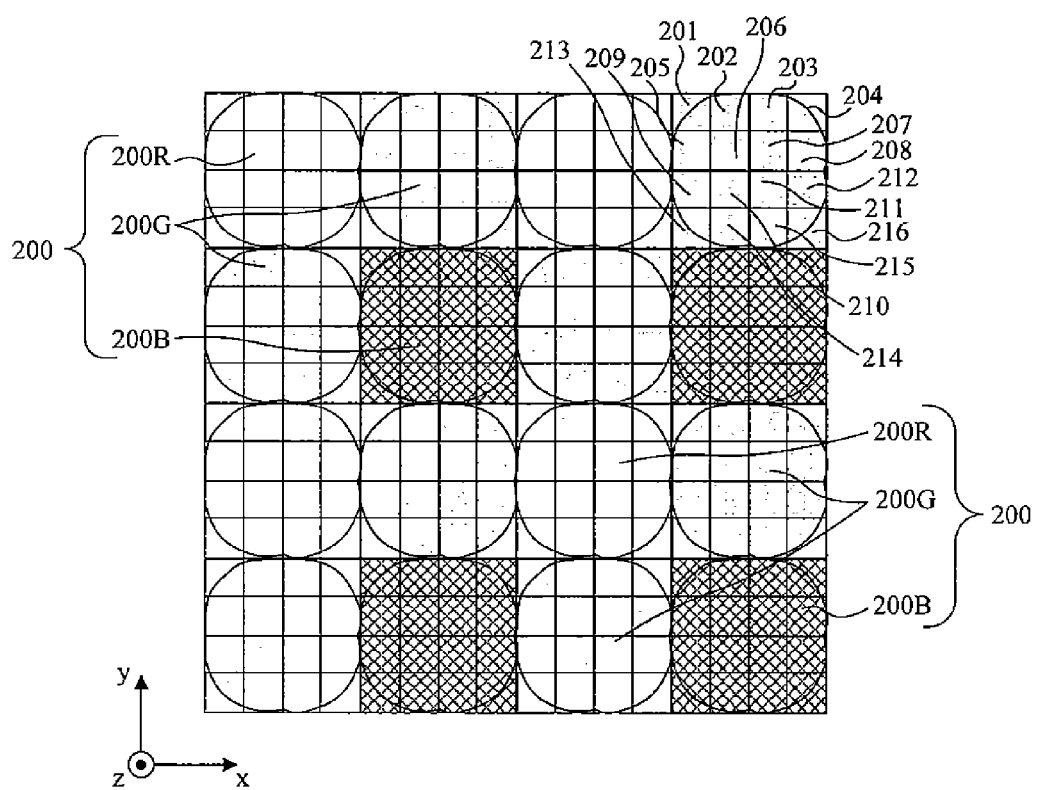
FIG. 2 shows pixel arrangement of the image sensor of Embodiment 1.

Next, pixel arrangement of the image sensor 107 of this embodiment will be described with reference to FIG. 2. FIG. 2 shows pixel arrangement in an area of 16 pixels (200R, 200G and 200B) including 4 pixel lines×4 pixel columns in the image sensor 107 as the two-dimensional CMOS sensor. FIG. 2 also shows, in each pixel, sub-pixels 201 to 216 arranged in 4 lines×4 columns ($N_\theta \times N_\theta$). That is, FIG. 2 shows an area of 256 sub-pixels including 16 sub-pixel lines×16 sub-pixel columns. In an actual image sensor 107, the pixels arranged in 4 pixel lines×4 pixel columns (the sub-pixels arranged in 16 sub-pixel lines×16 sub-pixel columns) shown in FIG. 2 is repeatedly arranged in horizontal and vertical directions.

Such pixel arrangement forms an image sensor including, for example, about eight million pixels arranged in horizontal 3480 pixel lines×vertical 2320 pixel columns (about 128 million sub-pixels arranged in horizontal 13920 sub-pixel lines× vertical 9280 sub-pixel columns). In this example, a pixel arrangement cycle (pitch) $\Delta X$ is 8.0 μm, and a sub-pixel arrangement cycle (pitch) $\Delta x$ is 2.0 μm.

In a pixel group 200 including 2 adjacent pixel lines×2 adjacent pixel columns among the pixels including 4 pixel lines×4 pixel columns shown in FIG. 2, two pixels 200G arranged at diagonal positions are green pixels having a spectral sensitivity of G (green). Moreover, other two pixels 200R and 200B are respectively a pixel having a spectral sensitivity of R (red) and a spectral sensitivity of B (blue).

FIG. 3A shows a pixel structure of each pixel (200R, 200G and 200B) shown in FIG. 2, which is viewed from a light-receiving surface side (+z side) of the image sensor 107. FIG.

3B shows a cross section of the pixel structure cut along an a-a line in FIG. 3A and viewed from a −y side.

In one pixel, a microlens 350 that collects entering light is provided on a light-receiving surface side in the pixel, and plural ($N_\theta=4$ in this embodiment) photoelectric conversion portion groups 306, 307, 310 and 311 that photoelectrically convert the entering light passing through the microlens 350 are provided. As shown in FIG. 3A, the four photoelectric conversion portion groups 306, 307, 310 and 311 are arranged separately from one another with a cross-shaped separating zone S thereamong. The separating zone S is formed such that its center (intersection) is located at a center of the pixel. The four photoelectric conversion portion groups 306, 307, 310 and 311 in this embodiment correspond to "plural photoelectric conversion portions separated from one another with a separating zone thereamong".

Each photoelectric conversion portion group includes $N_\theta/2$ (=2) photoelectrical conversion portions in an x direction and $N_\theta/2$(=2) photoelectrical conversion portions in a y direction. In other words, the four photoelectric conversion portion groups 306, 307, 310 and 311 wholly include sixteen photoelectric conversion portions 301 to 316 constituted by $N_\theta$(=4) photoelectric conversion portions arranged in the x direction and $N_\theta$(=4) photoelectric conversion portions arranged in the y direction. The photoelectric conversion portions 301 to 316 respectively correspond to the sub-pixels 201 to 216 shown in FIG. 2.

The microlens 350 in this embodiment includes $N_\theta$(=4) sub-microlenses 351 to 354. The sub-microlenses 351 to 354 respectively have apexes decentered with respect to the center of the pixel in diagonal 45 degree directions (upper rightward, lower rightward, upper leftward and lower leftward in FIG. 3A) that are separation directions of the photoelectric conversion portion groups 306, 307, 310 and 311. Each apex of the sub-microlens is a point through which an optical axis of the sub-microlens passes. A direction in which the optical axis of each sub-microlens extends corresponds to an optical axis direction of the microlens.

Each sub-microlens is formed so as to have a shape in contact (line contact) with other two sub-microlenses adjacent thereto in the horizontal and vertical directions at linear boundaries. FIG. 3A shows an outline of each sub-microlens by a broken line in a case of assuming that each sub-microlens has a circular shape centering on its apex thereof.

In the cross section shown in FIG. 3B, the apex of each sub-microlens is located at an outer edge of the separating zone S. In other words, in FIG. 3B, the apex of each sub-microlens is located just above (on a dashed-dotted line passing) a separating zone side edge of the photoelectric conversion portion group 310 or 311.

However, it is only necessary that, in FIG. 3B, the apex of each sub-microlens be decentered with respect to the center of the pixel and be located within an area above the separating zone S, that is, be located within an area on and between the dashed-dotted lines so as to overlap the separating zone S in the optical axis direction of the microlens 350. The area above the separating zone S (area overlapping the separating zone S in the optical axis direction of the microlens 350) is hereinafter referred to as "a separating zone side area". Of each sub-microlens (microlens 350), a lens portion included in the separating zone side area (that is, lens portion overlapping the separating zone S in the optical axis direction of the microlens 350) is hereinafter referred to as "a separating zone side lens portion".

A light flux passing through the separating zone side lens portion of each sub-microlens receives a diverging effect from its lens surface. Therefore, the light flux is directed to an area outside the separating zone side area (that is, an area outside the area on and between the dashed-dotted lines in FIG. 3B) where the photoelectric conversion portion group 310 or 311 is located, which is a problem. On the other hand, a light flux passing through, of each sub-microlens, a lens portion included in the area outside the separating zone side area receives a converging effect from its lens surface. The area outside the separating zone side area is also referred to as "an out-of-separating zone side area". Of each sub-microlens, the lens portion included in the out-of-separating zone side area (that is, lens portion not overlapping the separating zone S in the optical axis direction of the microlens 350) is also referred to as "an out-of-separating zone side lens portion".

As described above, in the microlens 350, the separating zone side lens portion overlapping the separating zone S in the optical axis direction of the microlens 350 has an effect of diverging the light flux entering thereinto. In other words, the separating zone side lens portion provides a negative power for the light flux entering thereinto.

In the pixel structure in this embodiment shown in FIGS. 3A and 3B, a central part of the pixel includes a floating diffusion (FD) portion 320 as a capacitance portion formed in the separating zone S for separately arranging the photoelectric conversion portion groups 306, 307, 310 and 311. However, this embodiment has a first structure in which a wiring layer 340 also serving as a light-blocking layer is formed between the microlens 350 and the FD portion 320 in the center part of the pixel such that the wiring layer 340 blocks a light flux passing through the microlens 350 and traveling toward the FD portion 320 such that the light flux does not enter the FD portion 320. In addition, this embodiment has a second structure in which the microlens 350 is formed by the sub-microlenses 351 to 354 whose apexes are decentered with respect to the center of the pixel such that the separating zone S (FD portion 320) and the wiring layer 340 provided in the central part of the pixel do not optically exist. This second structure prevents the separating zone S (FD portion 320) and the wiring layer 340 from optically influencing the photoelectric conversion portions disposed in the central part of the pixel. According to these first and second structures, this embodiment prevents the above-mentioned problem caused by the light flux from the microlens 350 entering the FD portion 320 disposed on the separating zone S.

The wording "the light flux does not enter the FD portion 320" includes not only a case where the light flux does not completely enter the FD portion 320, but also a case where the light flux enters the FD portion 320 to the extent that the light flux does not disturb acquisition of an electric signal corresponding to an intended light-receiving amount of the photoelectric conversion portion.

Moreover, the lens surface of the sub-microlens may have an aspheric shape or a spherical shape.

Each photoelectric conversion portion (301 to 316) is constituted by, though not shown, a PIN photodiode in which an intrinsic layer is disposed between a p-layer and an n-layer. However, each photoelectric conversion portion may be constituted by a PN junction photodiode without providing the intrinsic layer.

Furthermore, each pixel (200R, 200G and 200B) is provided with a color filter 360 disposed between the microlens 350 and the photoelectric conversion portions 301 to 316. Spectral transmittances of color filters provided for the respective sub-pixels may be changed as needed or no color filter may be provided.

The light flux entering one pixel is collected (converged) by the microlens 350 (sub-microlenses 351 to 354) to reach the photoelectric conversion portions 301 to 316 after being spectroscopically separated by the color filter 360.

Each photoelectric conversion portion generates paired electrons and holes according to its light-receiving amount. Then, after the electrons and the holes are separated from each other at a depletion layer, the electrons each having a negative charge is accumulated in the n-layer. On the other hand, the holes are exhausted outside the image sensor 107 through the p-layer connected with a constant-voltage source (not shown).

In this embodiment, as shown in FIG. 3A, a transfer gate 330 and the FD portion 320 are provided for every two photoelectric conversion portions so as to be adjacent thereto on both sides thereof. The separating zone S has a wide width to allow the FD portion 320 to be disposed therein. And, as shown in FIG. 3B, the wiring layer 340 is formed above the FD portion 320 (that is, on a microlens side further than the FD portion 320).

The electrons accumulated in the n-layer of each photoelectric conversion portion is transferred to the FD portion 320 through the transfer gate 330, and converted into a voltage signal.

Next, description of effects of this embodiment will be made. First of all, description of a comparative example shown in FIGS. 4A and 4B will be made. FIG. 4A shows a pixel viewed from a light-receiving surface side (+z side), and FIG. 4B shows a cross section of the pixel structure cut along a b-b line in FIG. 4A and viewed from a −y side.

This comparative example is provided with, for each pixel, a microlens 359 having only one apex (that is, including no sub-microlens) and plural (four) photoelectric conversion portion groups 306, 307, 310 and 311 as well as this embodiment. As shown in FIG. 4A, as well as this embodiment, the four photoelectric conversion portion groups 306, 307, 310 and 311 are separated from one another with a cross-shaped separating zone S thereamong, the separating zone being formed such that its center is located at a center of the pixel. Moreover as well as this embodiment, the separating zone S has a wide width to allow an FD portion 320 to be disposed therein.

In FIG. 4B, a light flux entering a lens surface of the microlens 359 having only one apex receives a converging effect from an entire area of the lens surface.

The separating zone S into which the light flux converged by the microlens 359 enters generates paired electrons and holes according to its light-receiving amount. However, when the width of the separating zone S is larger than a diffusion length of charges, part of the generated paired electrons and holes recombine to re-emit light, before they reach a depletion layer of the photoelectric conversion portion adjacent to the separating zone S to be separated from one another. Therefore, in the comparative example, the separating zone S has a lower photo sensitivity than those of the photoelectric conversion portions 301 to 316. Moreover, also in the case where the wiring layer 340 and the light-blocking layer (not shown) are provided above the separating zone S (on the microlens side), the separating zone S has a lower photo sensitivity than those of the photoelectric conversion portions 301 to 316.

Such a low photo sensitivity of the separating zone S forms a low sensitivity area corresponding to the cross shape of the separating zone S (that is, a separating shape of the four photoelectric conversion portion groups 306, 307, 310 and 311) in a pupil intensity distribution (incident angle distribution of a light-receiving ratio), which causes unnatural blur in a captured image produced by using the image sensor 107.

On the other hand, this embodiment forms the microlens 350 to have the four sub-microlenses 351 to 354 whose apexes are decentered with respect to the center of the pixel in the separation directions of the four photoelectric conversion portion groups 306, 307, 310 and 311.

Figures 5A, 5B:
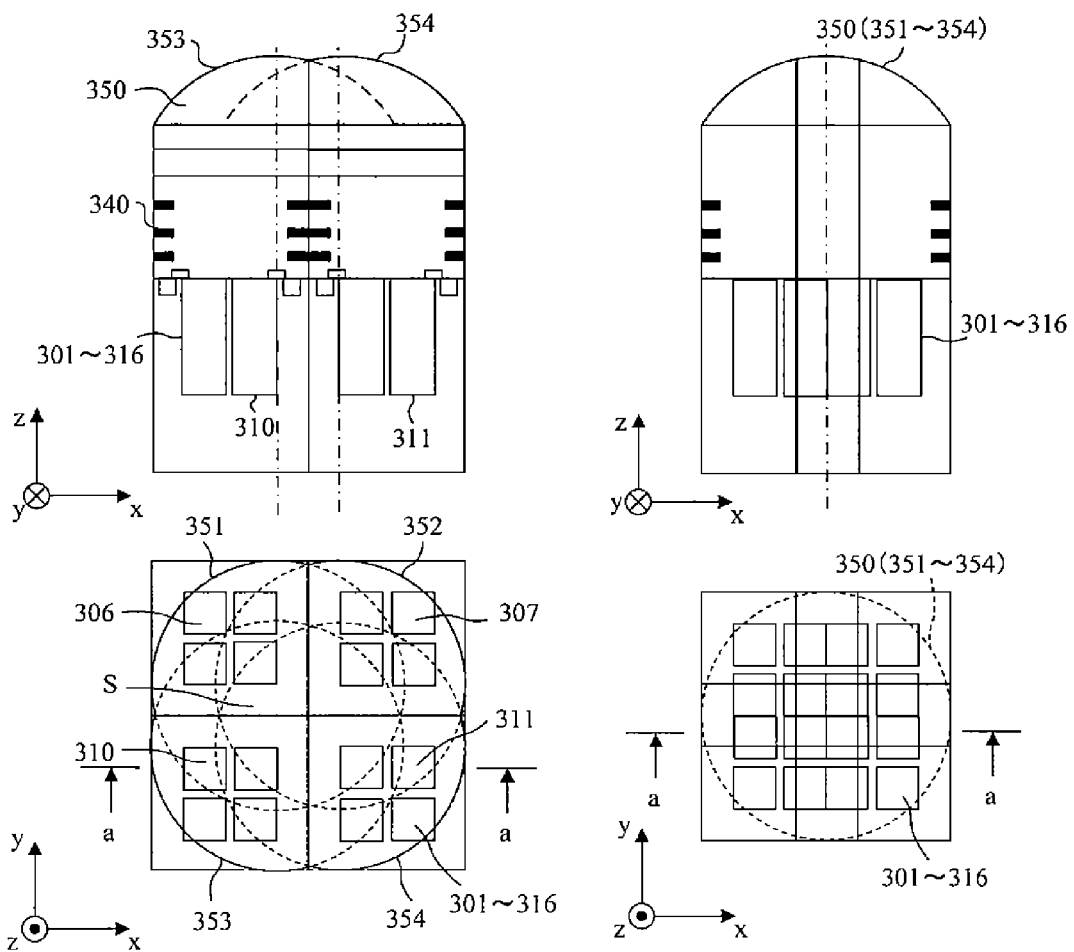
FIGS. 5A and 5B shows a pixel structure of the image sensor of Embodiment 1 and a pixel structure optically equivalent to that of Embodiment 1.

FIG. 5A shows the sub-microlenses 351 to 354 and the four photoelectric conversion portion groups 306, 307, 310 and 311, which are extracted from the pixel structure shown in FIGS. 3A and 3B. Reconstructing the pixel structure shown in FIG. 5A such that the apexes (optical axes) of all the sub-microlenses 351 to 354 overlap one another provides a pixel structure optically almost equivalent to that shown in FIG. 5B.

FIG. 5B shows an optical state in which the decentering amount of the apexes (that is, distances among the optical axes) of the sub-microlenses 351 to 354 are set appropriately for the width of the separating zone S in the pixel structure shown in FIG. 5A. This state can make the separating zone S having a wide width optically invalidated (or narrow). In other words, this state makes it possible that the light passing through each sub-microlens does not enter the separating zone S. Moreover, this state also can make the wiring layer 340 provided near the center of the pixel optically invalidated.

Therefore, this embodiment suppresses influence of the lower sensitivity area caused in the pupil intensity distribution due to the separated arrangement of the photoelectric conversion portions. That is, generation of the unnatural blur can be prevented in the captured image produced by using the image sensor 107.

The wording "the light flux does not enter the separating zone S" includes not only a case where the light flux does not completely enter the separating zone S, but also a case where the light flux enters the separating zone S to the extent that the above-mentioned low sensitivity area is not formed.

Adjusting the decentering amount of the apexes of the sub-microlenses 351 to 354 also makes it possible to partially overlap the four photoelectric conversion portion groups 306, 307, 310 and 311.

Figure 6:
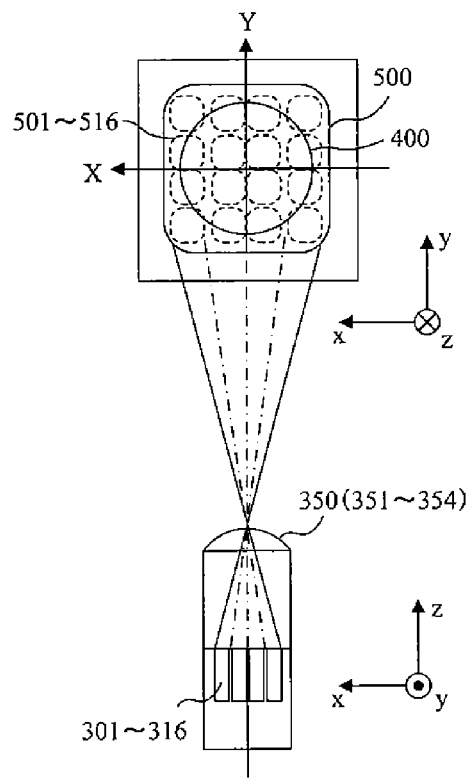
FIG. 6 shows pupil division in Embodiment 1.

FIG. 6 shows a correspondence relationship between the photoelectric conversion portions and the plural partial areas of the exit pupil (partial pupil areas) of the image capturing optical system in the pixel structure shown in FIG. 5B. As described above, the pixel structure shown in FIG. 5B makes the separating zone S and the wiring layer 340 that are provided near the center of the pixel optically invalidated, which is almost equivalent to that in this embodiment.

In FIG. 6, reference numeral 400 denotes the exit pupil of the image capturing optical system. A light flux from an object passes through the exit pupil 400 of the image capturing optical system to enter a pixel disposed on (or near) an imaging surface of the image capturing optical system. In FIG. 6, for matching x and y axes showing the pixel structure with exit pupil side coordinate axes, the x and y axes are inversed with respect to those in FIGS. 3 to 5.

Reference numeral 500 denotes a pupil area where light fluxes passing therethrough can be received by all the photoelectric conversion portions 301 to 316 (sub-pixels 201 to 216) separated into $N_\theta \times N_\theta (=4 \times 4)$ portions in one pixel (200R, 200G and 200B). Reference numerals 501 to 516 show the partial pupil areas divided into $N_\theta \times N_\theta (=4 \times 4)$ areas in the pupil area 500. The partial pupil areas 501 to 516 are in a conjugate relationship with light-receiving surfaces of the photoelectric conversion portions 301 to 316 with respect to the microlens 350 (sub-microlenses 351 to 354), and thereby the light fluxes from the partial pupil areas 501 to 516 are respectively received by the photoelectric conversion portions 301 to 316.

In this embodiment, a pupil distance is tens of millimeters, and on the other hand, a diameter of the microlens 350 is several micrometers. Therefore, an aperture value of the microlens 350 is several tens of thousands, which causes blur by diffraction of a level of several tens of millimeters. Thus, an optical image formed on the light-receiving surface of each photoelectric conversion portion does not become a clear image of the pupil area or the partial pupil area, but becomes a pupil intensity distribution (incident angle distribution of the light-receiving ratio).

As described above, this embodiment provides the wiring layer 340 also serving as the light-blocking layer between the microlens 350 and the FD portion 320 in the central part of the pixel. Moreover, this embodiment arranges the sub-microlenses 351 to 354 such that their apexes are decentered with respect to the center of the pixel, thereby making the separating zone S formed among the four photoelectric conversion portion groups 306, 307, 310 and 311 optically invalidated. That is, this embodiment prevents the light passing through each sub-microlens from entering the separating zone S. Accordingly, this embodiment can suppress the influence of the low sensitivity area caused in the pupil intensity distribution by the separated arrangement of the four photoelectric conversion portion groups 306, 307, 310 and 311.

In a case of arranging the apexes (optical axes) of the sub-microlenses 351 to 354 so as to be decentered with respect to the center of the pixel, the width of the separating zone S can be narrowed by an amount corresponding to the distance among the optical axes of the sub-microlenses 351 to 354. Thus, in order to make the separating zone S optically invalidated, it is desirable that a widest width of the separating zone S and the distance among the optical axes of the sub-microlenses 351 to 354 be approximately equal to each other. Specifically, the distance among the optical axes of the sub-microlenses 351 to 354 is larger than half the widest width of the separating zone S and smaller than 1.5 times the widest width of the separating zone S.

Moreover, this embodiment treats, as shown in FIG. 3A, one sub-microlens and one photoelectric conversion portion group including the photoelectric conversion portions (sub-pixels) separated into 2×2 portions as one structural unit. Such a structural unit inevitably enables provision of the four FD portions below the wiring layer 340 also serving as the light-blocking layer (that is, on an opposite side to the sub-microlens). Thus, it is desirable that each pixel be constituted by the plural photoelectric conversion portion groups each including the photoelectric conversion portions (sub-pixels) separated into 2×2 portions.

In this embodiment, it is desirable to suppress light-receiving crosstalk among the four photoelectric conversion portion groups 306, 307, 310 and 311. Thus, it is desirable to form a wiring layer Or a light-blocking layer to block entering light between a boundary area of each sub-microlens (351 to 354) in the microlens 350 and each photoelectric conversion portion.

Next, description will be made of a case where plural photoelectric conversion portion groups corresponding to the above-mentioned photoelectric conversion portion groups 306, 307, 310 and 311 photoelectrically convert plural light fluxes passing through mutually different area of an exit pupil of an image capturing optical system and then output focus detection signals to be used for phase difference detection. Such a phase difference detection method using pixels (photoelectric conversion portion groups) provided on an image sensor is called an image sensor phase difference detection method, and autofocus (AF) using a phase difference detected by this method is called an image sensor phase difference AF.

Figure 10:
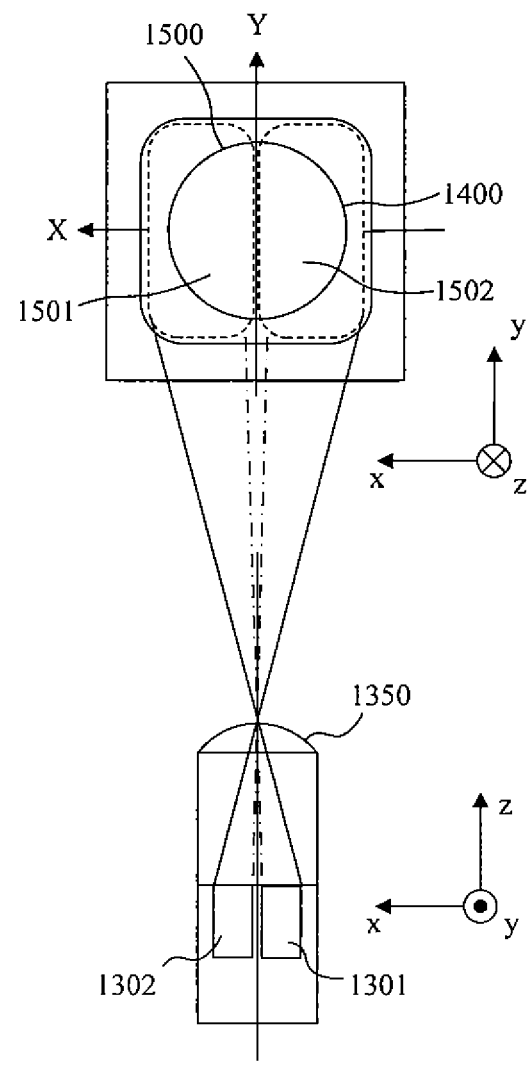
FIG. 10 shows a principle of image sensor phase difference AF performed by using the image sensor of Embodiment 1.

FIG. 10 shows an exemplary principle of the image sensor phase difference AF. The image sensor is disposed at or near an imaging surface of the image capturing optical system. A light flux from an object passes through an exit pupil 1400 of the image capturing optical system to enter pixels. Partial pupil areas 1501 and 1502 are in an approximately conjugate relationship with light-receiving surfaces of the photoelectric conversion portion groups 1301 and 1302 separated into N1×N2 (1×2) groups with respect to the microlens, which shows partial pupil areas where the light fluxes therefrom can be respectively received by the photoelectric conversion portion groups 1301 and 1302. Moreover, a pupil area 1500 is a pupil area where the light flux therefrom is received by an entire pixel (image capturing pixel) 1200G including all the photoelectric conversion portion groups 1301 and 1302 separated into N1×N2 (1×2) groups.

In the configuration shown in FIG. 10, a pupil distance is tens of millimeters, and on the other hand, a diameter of the microlens 1350 is several micrometers. Therefore, an aperture value of the microlens 1350 is several tens of thousands, which causes blur by diffraction of a level of several tens of millimeters. Thus, an optical image formed on the light-receiving surface of each photoelectric conversion portion does not become a clear image of the pupil area or the partial pupil area, but becomes a pupil intensity distribution (incident angle distribution of a light-receiving ratio).

In FIG. 10, the partial pupil area 1501 for the photoelectric conversion portion group (first focus detecting pixel) 1301 is in an approximately conjugate relationship, with respect to the microlens, with the light-receiving surface of the photoelectric conversion portion group 1301 whose centroid is decentered in a −x direction, which shows a pupil area where the light flux therefrom can be received by the photoelectric conversion portion group 1301. The partial pupil area 1501 for the photoelectric conversion portion group 1301 has a centroid decentered in a +X direction on a pupil surface.

Moreover, in FIG. 10, the partial pupil area 1502 for the photoelectric conversion portion group (second focus detecting pixel) 1302 is in an approximately conjugate relationship, with respect to the microlens, with the light-receiving surface of the photoelectric conversion portion group 1302 whose centroid is decentered in a +x direction, which shows a pupil area where the light flux therefrom can be received by the photoelectric conversion portion group 1302. The partial pupil area 1502 for the photoelectric conversion portion group 1302 has a centroid decentered in a −X direction on the pupil surface.

In the following description, a signal acquired from the photoelectric conversion portion group 1301 constituting part of the pixel 1200G (or 1200R, 1200B) in the image sensor is defined as an A image. Similarly, a signal acquired from the photoelectric conversion portion group 1302 constituting part of the pixel 1200G (or 1200R, 1200B) in the image sensor is defined as a B image. Calculating a relative image displacement amount (that is, a phase difference) between the A and B images to convert it into a defocus amount (that is, an out-of-focus amount) enables focus detection by the image sensor phase difference detection method.

On the other hand, in FIG. 10, the pupil area 1500 for the pixel 1200G including both the photoelectric conversion portion groups 1301 and 1302 is formed as large as possible such that the photoelectric conversion portion groups 1301 and 1302 can receive a greater amount of the light flux passing through the exit pupil 1400 of the image capturing optical system, and such that a centroid of the pupil area 1500 approximately coincides with the optical axis of the image capturing optical system at a predetermined pupil distance.

For each pixel 1200G (or 122R, 1200B) in the image sensor, adding the focus detection signal acquired from the photoelectric conversion portion group 1301 and the focus detection signal acquired from the photoelectric conversion portion group 1302 enables production of a captured image with resolution corresponding to an effective pixel number of the image sensor.

Embodiment 2

Figure 7A:
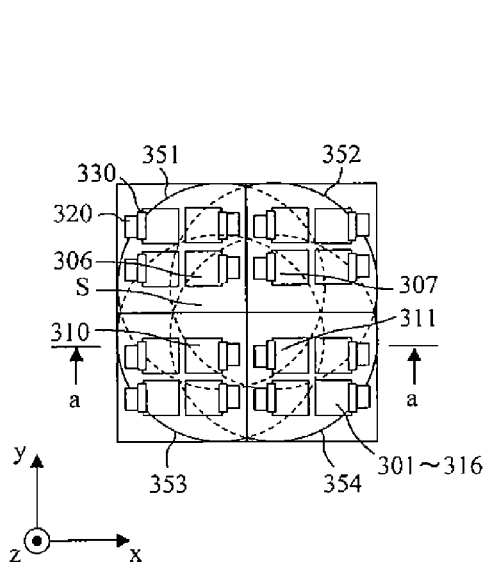
FIGS. 7A and 7B respectively show a front view and a cross-sectional view of a pixel in an image sensor that is Embodiment 2 of the present invention.
Figure 7B:
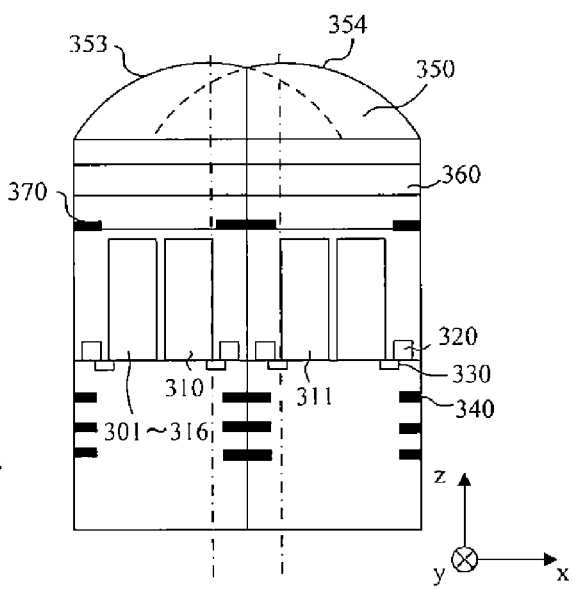

FIG. 7A shows a pixel structure of each pixel in an image sensor that is a second embodiment (Embodiment 2) of the present invention, which is viewed from a light-receiving surface side (+z side) of the image sensor 107. FIG. 7B shows a cross section of the pixel structure cut along an a-a line in FIG. 7A and viewed from a −y side. Although the image sensor of Embodiment 1 is a frontside illumination CMOS sensor, the image sensor of this embodiment is a backside illumination CMOS sensor. Constituent elements in this embodiment having the same functions as those in Embodiment 1 are denoted by the same reference numerals as those in Embodiment 1.

This embodiment forms a light-blocking layer 370 between the microlens 350 and the photoelectric conversion portions 301 to 316. Moreover, this embodiment forms a wiring layer 340 on an opposite side to the microlens 350 with respect to the photoelectric conversion portions 301 to 316 and the FD portion 320, that is, an opposite side to a light entering side with respect thereto. The structure other than the above is the same as that in Embodiment 1.

This embodiment also can make the separating zone S formed among the four photoelectric conversion portion groups 306, 307, 310 and 311 optically invalidated. That is, this embodiment prevents the light passing through each sub-microlens from entering the separating zone S. Accordingly, this embodiment can suppress the influence of the low sensitivity area caused in the pupil intensity distribution by the separated arrangement of the four photoelectric conversion portion groups 306, 307, 310 and 311.

In other words, this embodiment can eliminate optical influence of the wiring layer 340 while preventing the light fluxes from entering the separating zone S formed among the four photoelectric conversion portion groups 306, 307, 310 and 311 and the FD portion 320 formed therein. Therefore, this embodiment can acquire, from the photoelectric conversion portion disposed in the central part of the pixel, an accurate electric signal corresponding to its light-receiving amount, while maintain a good pupil dividing performance.

Embodiment 3

FIG. 8A shows a pixel structure of each pixel in an image sensor that is a third embodiment (Embodiment 3) of the present invention, which is viewed from a light-receiving surface side (+z side) of the image sensor 107. FIG. 8B shows a cross section of the pixel structure cut along an a-a line in FIG. 8A and viewed from a −y side. Although the image sensor of Embodiment 1 includes the sub-microlenses 351 to 354 whose intersection portions form an acute angle, the image sensor of this embodiment includes sub-microlenses 351 to 354 whose intersection portions are formed by smoothly curved surfaces. When producing the microlens by a photolithography process using a gray-tone mask or the like, the intersections of the sub-microlenses 351 to 354 are often formed as smoothly curved surfaces. Constituent elements in this embodiment having the same functions as those in Embodiment 1 are denoted by the same reference numerals as those in Embodiment 1.

The "smoothly curved surface" forming the intersection portions of the sub-microlenses 351 to 354 has, when viewed in the cross section of FIG. 8B, a curved shape starting from a highest position just above an outer edge of the separating zone S and reaching a lowest position at a center of the pixel via an inflection point at a middle position between the highest position and the lowest position.

A light flux passing through each sub-microlens in an area (separating zone side area) on and between dashed-dotted lines in FIG. 8B (that is, through the separating zone side lens portion of each sub-microlens) receives a diverging effect from its lens surface. Therefore, the light flux is directed to an area (out-of-separating zone side area) outside the area on and between the dashed-dotted lines in FIG. 8B where the photoelectric conversion portion group 310 or 311 is located, which is a problem.

On the other hand, a light flux passing through, of each sub-microlens, a lens portion (out-of-separating zone side lens portion) included in the out-of-separating zone side area receives a converging effect from its lens surface.

Thus, in the microlens 350, the separating zone side lens portion overlapping the separating zone S in the optical axis direction of the microlens 350 has an effect of diverging the light flux entering thereinto. In other words, the separating zone side lens portion provides a negative power for the light flux entering thereinto.

This embodiment also can make the separating zone S formed among the four photoelectric conversion portion groups 306, 307, 310 and 311 optically invalidated. That is, this embodiment prevents the light passing through each sub-microlens from entering the separating zone S. Accordingly, this embodiment can suppress the influence of the low sensitivity area caused in the pupil intensity distribution by the separated arrangement of the four photoelectric conversion portion groups 306, 307, 310 and 311.

Embodiment 4

FIG. 9A shows a pixel structure of each pixel in an image sensor that is a fourth embodiment (Embodiment 4) of the present invention, which is viewed from a light-receiving surface side (+z side) of the image sensor 107. FIG. 9B shows a cross section of the pixel structure cut along an a-a line in FIG. 9A and viewed from a −y side. Although the image sensor of Embodiment 1 includes the sub-microlenses 351 to 354 whose intersection portion form an acute angle, the image sensor of this embodiment includes sub-microlenses 351 to 354 whose apexes are connected by a planar surface. Constituent elements in this embodiment having the same functions as those in Embodiment 1 are denoted by the same reference numerals as those in Embodiment 1.

A light flux passing through each sub-microlens in an area (separating zone side area) on and between dashed-dotted lines in FIG. 9B passes through the planar surface as the separating zone side lens portion.

On the other hand, a light flux passing through, of each sub-microlens, a lens portion (out-of-separating zone side lens portion) included in the out-of-separating zone side area (described in Embodiment 1) receives a converging effect from its lens surface.

The separating zone side lens portion provides no power for the light flux entering thereinto.

This embodiment also can make the separating zone S formed among the four photoelectric conversion portion groups 306, 307, 310 and 311 optically invalidated. That is, this embodiment prevents the light passing through each sub-microlens from entering the separating zone S. Accordingly, this embodiment can suppress the influence of the low sensitivity area caused in the pupil intensity distribution by the separated arrangement of the four photoelectric conversion portion groups 306, 307, 310 and 311.

The image sensor of each embodiment described above can be used not only as image sensors for general digital cameras such as one shown in FIG. 1, but also as an image sensor for a Light Field camera disclosed in "Stanford Tech Report CTSR 2005-02 and 1 (2005)".

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application Nos. 2011-219042 and 2011-219041, filed on Oct. 3, 2011 and 2012-202232, filed on Sep. 14, 2012 which are hereby incorporated by reference herein in their entirety.

What is claimed is:

1. An image sensor comprising:
plural pixels each including (a) a microlens and (b) plural photoelectric conversion portions separated from one another with a separating zone thereamong and photoelectrically converting light fluxes passing through the microlens,
wherein the microlens includes a separating zone side lens portion overlapping the separating zone in an optical axis direction of the microlens, and
wherein, when the photoelectric conversion portions photoelectrically convert the light fluxes passing through mutually different partial pupil areas an image optical system, the separating zone side lens portion provides no power or a negative power for a light flux entering the separating zone side lens portion so that the light flux entering the separating zone side lens portion does not enter the separating zone.

2. An image sensor according to claim 1, wherein the photoelectric conversion portions output, by photoelectrically converting the light fluxes passing through the mutually different areas of the exit pupil of the image optical system, focus detection signals to be used for phase difference detection.

3. An image pickup apparatus comprising:
an image optical system; and
an image sensor,
wherein the image sensor comprises:
plural pixels each including (a) a microlens and (b) plural photoelectric conversion portions separated from one another with a separating zone thereamong and photoelectrically converting light fluxes passing through mutually different partial pupil areas of the image optical system and through the microlens,
wherein the microlens includes a separating zone side lens portion overlapping the separating zone in an optical axis direction of the microlens, and
wherein the separating zone side lens portion provides no power or a negative power for a light flux entering the separating zone side lens so that the light flux entering the separating zone side lens portion does not enter the separating zone.

4. An image sensor comprising:
plural pixels each including (a) a microlens and (b) plural photoelectric conversion portions separated from one another with a separating zone thereamong and photoelectrically converting light fluxes passing through the microlens,
wherein the microlens includes a separating zone side lens portion overlapping the separating zone in an optical axis direction of the microlens, and
wherein, when the photoelectric conversion portions photoelectrically convert the light fluxes passing through mutually different partial pupil areas of an image optical system, the separating zone side lens portion has a diverging effect for a light flux entering the separating zone side lens portion so that the light flux entering the separating zone side lens portion does not enter the separating zone.

5. An image sensor according to claim 4, wherein the photoelectric conversion portions output, by photoelectrically converting the light fluxes passing through the mutually different areas of the exit pupil of the image optical system, focus detection signals to be used for phase difference detection.

6. An image pickup apparatus comprising:
an image optical system; and
an image sensor,
wherein the image sensor comprises:
plural pixels each including (a) a microlens and (b) plural photoelectric conversion portions separated from one another with a separating zone thereamong and photoelectrically converting light fluxes passing through mutually different partial pupil areas of the image optical system and through the microlens,
wherein the microlens includes a separating zone side lens portion overlapping the separating zone in an optical axis direction of the microlens, and
wherein the separating zone side lens portion has a diverging effect for a light flux entering the separating zone side lens portion so that the light flux entering the separating zone side lens portion does not enter the separating zone.

7. An image sensor comprising:
plural pixels each including (a) a microlens and (b) plural photoelectric conversion portions separated from one another with a separating zone thereamong and photoelectrically converting light fluxes passing through the microlens,
wherein the microlens includes a separating zone side lens portion overlapping the separating zone in an optical axis direction of the microlens, and
wherein, when the photoelectric conversion portions output focus detection signals to be used for phase difference detection, the separating zone side lens portion provides no power or a negative power for a light flux entering the separating zone side lens portion so that the light flux entering the separating zone side lens portion does not enter the separating zone.

8. An image pickup apparatus comprising:
an image optical system; and
an image sensor,
wherein the image sensor comprises:
plural pixels each including (a) a microlens and (b) plural photoelectric conversion portions separated from one another with a separating zone thereamong and output focus detection signals to be used for phase difference detection and through the microlens,
wherein the microlens includes a separating zone side lens portion overlapping the separating zone in an optical axis direction of the microlens, and
wherein the separating zone side lens portion provides no power or a negative power for a light flux entering the separating zone side lens so that the light flux entering the separating zone side lens portion does not enter the separating zone.

9. An image sensor comprising:

plural pixels each including (a) a microlens and (b) plural photoelectric conversion portions separated from one another with a separating zone thereamong and photoelectrically converting light fluxes passing through the microlens, wherein the microlens includes a separating zone side lens portion overlapping the separating zone in an optical axis direction of the microlens, and wherein, when the photoelectric conversion portions output focus detection signals to be used for phase difference detection, the separating zone side lens portion has a diverging effect for a light flux entering the separating zone side lens portion so that the light flux entering the separating zone side lens portion does not enter the separating zone.

10. An image pickup apparatus comprising:

an image optical system; and an image sensor, wherein the image sensor comprises:

plural pixels each including (a) a microlens and (b) plural photoelectric conversion portions separated from one another with a separating zone thereamong and output focus detection signals to be used for phase difference detection and through the microlens, wherein the microlens includes a separating zone side lens portion overlapping the separating zone in an optical axis direction of the microlens, and wherein the separating zone side lens portion has a diverging effect for a light flux entering the separating zone side lens portion so that the light flux entering the separating zone side lens portion does not enter the separating zone.

* * * * *